United States Patent [19]

Jastrzebski et al.

[11] Patent Number: 4,554,570
[45] Date of Patent: Nov. 19, 1985

[54] VERTICALLY INTEGRATED IGFET DEVICE

[75] Inventors: Lubomir L. Jastrzebski, Plainsboro; Alfred C. Ipri, Princeton, both of N.J.

[73] Assignee: RCA Corporation, Princeton, N.J.

[21] Appl. No.: 500,399

[22] Filed: Jun. 2, 1983

[30] Foreign Application Priority Data

Jun. 24, 1982 [GB] United Kingdom ................. 8218286

[51] Int. Cl.[4] ..................... H01L 29/78; H01L 27/01; H01L 29/06; H01L 27/12

[52] U.S. Cl. .................................. 357/23.4; 357/23.7; 357/55; 357/4

[58] Field of Search ................. 357/23 TF, 23 UP, 4, 357/49, 55, 41, 59, 23 MG, 23 VD, 41, 22; 29/576 B, 576 T

[56] References Cited

U.S. PATENT DOCUMENTS

| 3,412,297 | 11/1968 | Amlinger | 357/23 VD |
| 3,564,358 | 2/1971 | Hahnlein | 357/40 |
| 3,600,651 | 8/1971 | Duncan | 357/59 |
| 4,101,350 | 7/1978 | Possley et al. | 148/175 |
| 4,375,717 | 3/1983 | Tonnel | 29/571 |
| 4,472,729 | 9/1984 | Shibata et al. | 357/59 |
| 4,479,297 | 6/1984 | Mizutani | 357/41 |

FOREIGN PATENT DOCUMENTS

| 0038278 | 4/1978 | Japan | 357/41 |
| 0075877 | 7/1978 | Japan | 357/23 TF |
| 0142189 | 12/1978 | Japan | 357/23.4 |
| 5779660 | 5/1980 | Japan | 357/23.4 |
| 58-35979 | 3/1983 | Japan | 357/22 |
| 0056327 | 4/1983 | Japan | 29/576 T |

Primary Examiner—Andrew J. James
Assistant Examiner—Mark Prenty
Attorney, Agent, or Firm—Birgit E. Morris; Donald S. Cohen; Kenneth R. Glick

[57] ABSTRACT

An integrated device which incorporates a plurality of interconnected vertical IGFETs on a single substrate is described. A monocrystalline silicon region extends from an area of the substrate surface and a plurality of insulated gate electrodes are disposed so as to be contiguous with the monocrystalline silicon region. Each of the insulated gate electrodes can be selectively biased with a predetermined voltage so as to create an inversion channel in a segment of the monocrystalline silicon region contiguous therewith.

9 Claims, 6 Drawing Figures

VERTICALLY INTEGRATED IGFET DEVICE

The present invention relates to an integrated device which incorporates a plurality of interconnected vertical insulated gate field effect transistors (IGFETs) on a single substrate. More particularly, the present invention relates to a structure wherein multiple insulated gate electrodes control segments of a single monocrystalline silicone region which extends from a surface of the substrate.

BACKGROUND OF THE INVENTION

A vertical IGFET, as defined herein, refers to a transistor wherein current flow is regulated along a direction which is perpendicular to the major surfaces of the substrate on which the transistor is disposed. The source, body and drain regions are in an overlying relationship to one another, and an insulated gate electrode is contiguous with at least a portion of the body region. When the insulated gate electrode is appropriately electrically biased, an inversion channel is formed between the source and drain regions in that portion of the body region adjacent thereto. The fundamental structure for such a vertical IGFET device is disclosed in copending U.S. patent application Ser. No. 489,307, SELF-ALIGNED VERTICAL IGFET AND METHOD FOR FABRICATING SAME, L. L. Jastrzebski et al., filed Apr. 28, 1983 and now U.S. Pat. No. 4,530,149, This fundamental structure includes a substrate having a monocrystalline silicon portion at a major surface thereof and an insulated gate electrode disposed on the substrate surface. The insulated gate electrode, which comprises a conductive gate electrode which is substantially surrounded by gate insulation, includes an aperture to an area of the monocrystalline silicon portion. A monocrystalline, epitaxial silicon region extends from the substrate surface within the aperture to a height substantially equal to that of the insulated gate electrode. That portion of the monocrystalline silicon region within the aperture and in opposition to the conductive gate electrode is doped so as to form the body region of the FET. Thus, the thickness of the conductive gate electrode determines gate length. Portions of the monocrystalline silicon region underlying and overlying the body region are oppositely doped so as to form source and drain regions.

Such vertical IGFETs can be fabricated utilizing the epitaxial lateral overgrowth (ELO) fabrication technique disclosed in copending U.S. patent application Ser. No. 338,958, METHOD FOR GROWING MONOCRYSTALLINE SILICON ON A MASK LAYER, J. F. Corboy et al., filed Jan. 12, 1982 and now abandoned. Basically, the ELO process involves a repetitious, two phase, deposition/etch cycle whereby monocrystalline silicone is grown from a monocrystalline silicon surface which is exposed within the aperture of an overlying mask. In accordance with the present invention there is disclosed an integrated device which incorporates a plurality of vertical IGETs, yet consumes a substrate surface area substantially equal to that of a single vertical IGFEt.

SUMMARY OF THE INVENTION

An integrated device which incorporates a plurality of interconnected vertical IGFETs on a substrate surface includes a monocrystalline silicon region extending from an area of the substrate surface. A plurality of insulated gate electrodes which can be selectively biased are disposed such that each is contiguous with a segment of the monocrystalline silicon region. A predetermined voltage applied to a particular electrode will create an inversion channel in the segment of the monocrystalline silicon region contiguous therewith.

DETAILED DESCRIPTION

Figure 1:
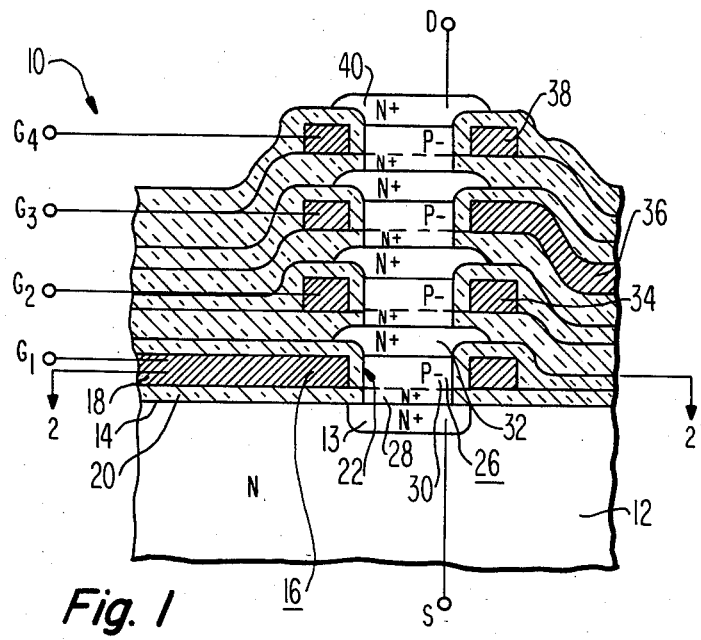
FIG. 1 is a sectional view of a vertically integrated IGFET device incorporating four series-connected vertical IGFETs.
Figure 2:
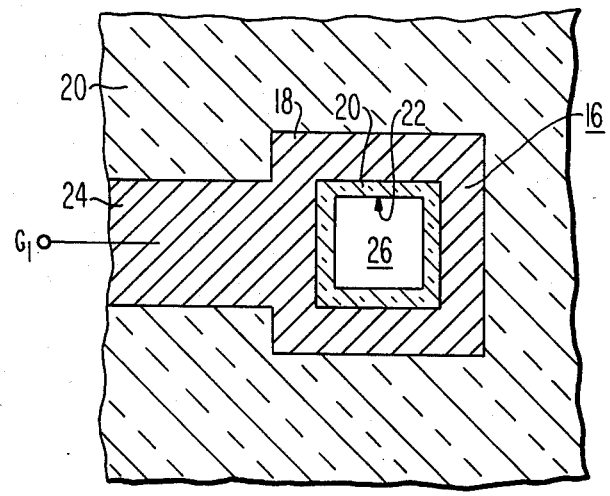
FIG. 2 is a view taken along section line 2—2 of FIG. 1.
Figure 3:
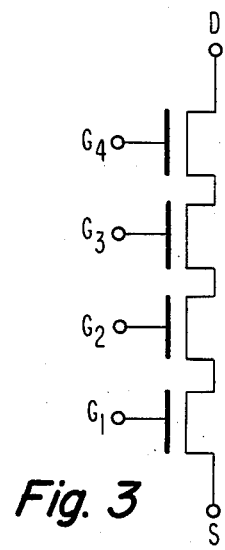
FIG. 3 is a schematic representation of the device of FIGS. 1 and 2.
Figure 4:
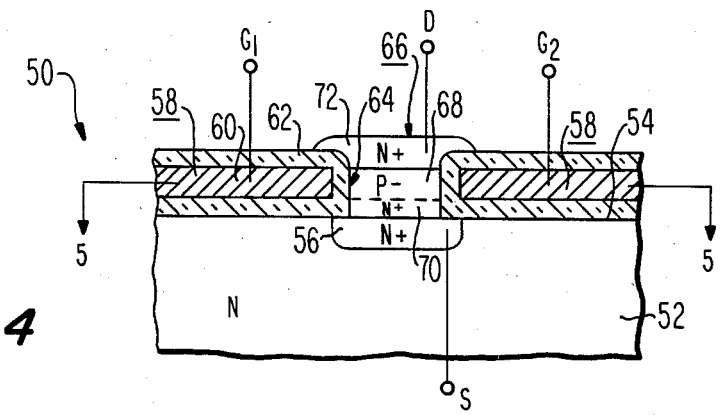
FIG. 4 is a sectional view of a vertically integrated IGFET device incorporating four vertical IGFETs connected in parallel.
Figure 5:
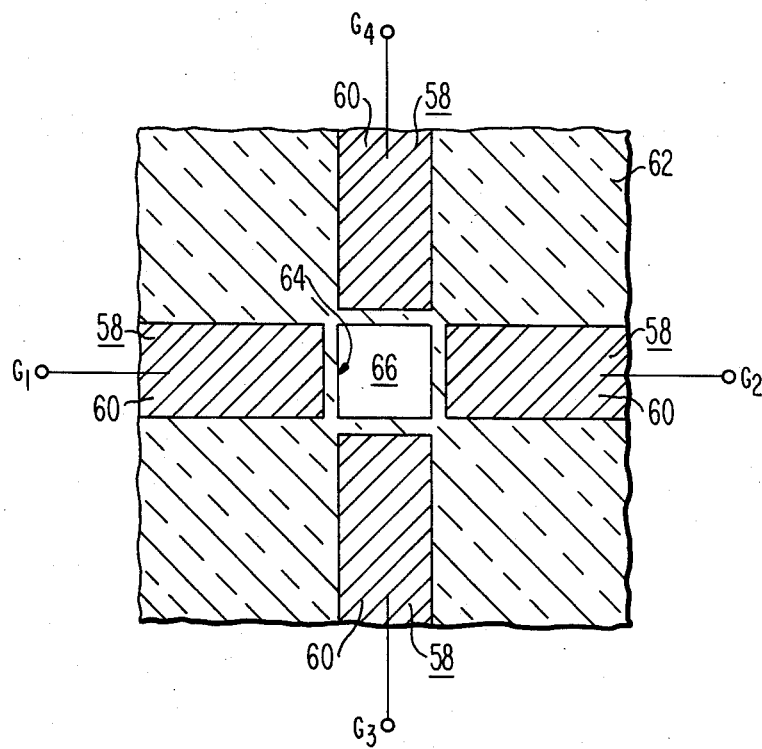
FIG. 5 is a view taken along section 5—5 of FIG. 4.
Figure 6:
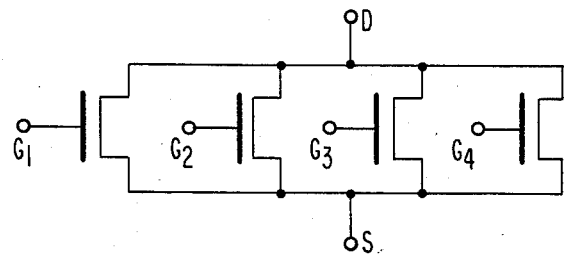
FIG. 6 is a schematic representation of the device of FIGS. 4 and 5.

A vertically integrated IGFET device of the present invention encompasses at least two general configurations; a series-connected device as illustrated in FIGS. 1-3, and a parallel-connected device as illustrated in FIGS. 4-6. The series-connected device, illustrated at 10, includes a monocrystalline silicon wafer 12, of N type conductivity, having a major surface 14. An N+ type contact region 13 is disposed within the semiconductor substrate 12 at the surface 14. As will become apparent, the inclusion of this N+ contact region 13 is not essential to the invention, although its use will serve to enhance device performance. In the completed device, contact region 13 will be connected to a source voltage as indicated at S.

A first insulated gate electrode 16, hereinafter first gate 16, is disposed across the substrate surface 14, and includes an aperture 22 to the substrate surface 14 at the location of the contact region 13. The first gate 16 comprises a gate electrode 18 of, for example, doped polycrystalline silicon, which is substantially surrounded by gate insulation 20 of, for example, silicon dioxide. The thickness of the gate electrode 18 determines the parameter of channel length, and it might have a value of approximately 1,000-50,000 Angstroms. The gate insulation thickness may vary at different areas of the gate electrode 18. For example, underlying the gate electrode it might be approximately 100-10,000 Angstroms thick, and above the electrode and within the aperture it might have a thickness of approximately 100-1,000 Anstroms.

As illustrated in FIG. 2, the first gate 16 and the aperture 22 therein might have a substantially rectangular shape, although a variety of other configurations might equivalently be used. The first gate 16 might also conveniently include a doped polycrystalline silicon gate lead 24 to facilitate interconnection to a source of gate voltage, as indicated at $G_1$.

A monocrystalline silicon region 26 extends from the substrate surface 14 so as to fill the aperture 22 in the first gate 16. That portion of the monocrystalline silicon region 26 which is adjacent to the contact region 13 is also of N+ type material, and forms the device source region 28. The thickness of the source region 28 is approximately equal to the thickness of the gate insulation which underlies the gate electrode 18. Overlying the source region 28 and forming a PN junction therewith is a P− type body region 30 which is preferably of lower dopant concentration than the source region 28. Overlying the body region 30 and forming a PN junction therewith is an N+ type drain region 32. Preferably, the drain region 32 also has a relatively high dopant concentration compared to the body region 30. Optimally, the body region 30 is disposed in direct opposition to the gate electrode 18 portion of the first gate 16. Thus, the source/body PN junction coincides with the boundary between the gate electrode 18 and the underlying portion of the gate insulation 20, and the body/drain PN junction coincides with the boundary between the gate electrode 18 and the overlying portion of the gate insulation 20.

Second, third and fourth gates, 34, 36 and 38, respectively, connected to biases $G_2$, $G_3$ and $G_4$, respectively, are disposed in seriatum over the first gate 16. These overlying gates 34, 36 and 38 are similar in structure to the first gate 16 and are disposed such that the apertures therein are coincident with the underlying aperture 22 in the first gate 16. The monocrystalline silicon region 26 extends through the apertures in each of the overlying gates and is again doped so as to yield a P− type body region in opposition to the gate electrode portion of each of the gates. The uppermost portion of the monocrystalline silicon region 26 is the N+ type drain region 40 of the fourth gate 38 and is connected to a source of drain voltage, as identified at D.

It should be noted that the doping profile at the monocrystalline silicon region 26 is not restricted to the particular one shown in FIG. 1. For example, an alternative embodiment comprises a monocrystalline silicon region 26 which is substantially entirely P− type material. Such a monocrystalline silicon region 26 would still have an N+ type drain region 40 as its uppermost portion, and may include some part of the N+ type source region 28 adjacent to the N+ type contact region 13. In the structure of this alternative embodiment it is desirable that the gate insulation between gate electrodes be relatively thin, such that when a pair of neighboring gate electrodes is appropriately biased the corresponding pair of inversion channels is interconnected. The fringe field created by the voltage on each of the neighboring gate electrodes will serve to create a connecting inversion channel in that portion of the monocrystalline silicon region 26 which is in opposition to the gate insulation between the neighboring gate electrodes.

As previously indicated, the structure of the present invention can be fabricated utilizing conventional semiconductor processing techniques which incorporate the ELO process for selective epitaxial deposition. For example, the first gate 16 can be initially formed on the substrate surface 14 and the monocrystalline silicon region 26 can then be formed by the ELO process through the thickness of the first gate 16. Although the ELO process can be terminated when the growing monocrystalline silicon reaches the height of the gate 16, it can also be grown to a thickness greater than that of the first gate 16, as shown in FIG. 1. When this occurs, the monocrystalline silicon grows laterally as well as vertically, thereby overlapping the gate 16. Such a structure may be desirable, for example, in that it provides a thicker drain region 32. Furthermore, the monocrystalline silicon region 26 can conveniently be doped simultaneously with the described epitaxial growth.

Following the information of the monocrystalline silicon region within the first gate 16, the second gate 34 can similarly be formed and the growth of the monocrystalline silicon region 26 can similarly be continued so as to extend through the second gate 34. This sequence can then be repeated a third and a fourth time, until the four-gate structure of the illustrated embodiment is fabricated.

As an alternative processing sequence, all gates can be fabricated prior to the growth of the monocrystalline silicon region 26. The monocrystalline silicon region can then be epitaxially grown, by the ELO technique, through the apertures in all of the gates. An exemplary process sequence might be:

(1) deposit initial gate insulation on the substrate surface;
(2) deposit and dope a polycrystalline silicon gate electrode;
(3) thermally oxidize the gate electrode;
(4) repeat steps (2) and (3) the desired number of times;
(5) define an aperture by repetitious oxide etch/polycrystalline silicon etch cycle;
(6) grow oxide within the aperture;
(7) etch the exposed initial gate insulation; and
(8) deposit and dope a monocrystalline silicon region within the aperture by the ELO technique.

A schematic representation of this structure is illustrated in FIG. 3. A source to drain voltage in this structure is controlled by four, series-connected gates. Each of the gates 16, 34, 36 and 38 controls a portion of the monocrystalline silicon region 26 which is contiguous therewith. Thus, in the series-connected device 10, four vertical IGFETs are provided on a substrate area which is substantially equivalent to the area which a single IGFET would consume.

FIGS. 4 and 5 illustrate the structure of a parallel-connected integrated IGFET device in accordance with the present invention. As before, an N type silicon substrate 52 having a major surface 54 is provided, and an optional N+ type contact region 56 is formed at the substrate surface 54. A plurality of gates 58, each of which again comprises a gate electrode 60 substantially surrounded by gate insulation 62, are disposed on the substrate surface 54.

In the illustrated embodiment, four such gates are provided. Each gate has a finger-like configuration and is connected to a source of gate voltage, as identified at $G_1$, $G_2$, $G_3$ and $G_4$. The four gates are disposed in a radial configuration on the surface 54 such that the ends of the fingers define an aperture 64 to the contact-region 56. Within this aperture 64, a monocrystalline silicon region 66 extends from the substrate surface 54. As discussed with respect to the series-connected device 10 of FIGS. 1 and 2, the monocrystalline silicon region 66 in the device 50 also includes a P− type body region 68 which is in direct opposition to the gate electrodes which surround it, and which is sandwiched between an underlying N+ type source region 70 and an overlying N+ type drain region 72. The fabrication and doping of the monocrystalline silicon region 66 can be performed in a manner similar to that described with reference to the series-connected device 10. A source of drain voltage, identied at D, is connected to the uppermost portion of the drain region 72, and a source voltage, S, is connected to the contact region 56, as shown in FIG. 1.

FIG. 6 schematically illustrates the parallel, four transistor structure of FIGS. 4 and 5. Appropriately biasing any of the gates in this structure will create an inversion channel in an adjacent segment of the body region 68, and thereby permit current flow between the source and drain regions 70 and 72. Hence, as with the series-connected device 10, each of the gates can be independently biased so as to selectively create an inversion channel in that portion of the monocrystalline silicon region contiguous therewith.

As should be obvious to one skilled in the art, the scope of the present invention is not strictly limited to the specific structures of the two embodiments described herein. For example, for clarity in description, the various semiconductor regions were described as being specifically of P or N type, whereas in practice the conductivity types of the various regions could be reversed. Similarly, the source and drain voltage sources can be reversed. Additionally, the relative conductivity between adjacent silicon regions can be manipulated. Furthermore, the invention is not limited to four-gate structures but is generally applicable to integrated devices incorporating two or more gates. Either of the embodiments can also be fabricated on an insulating substrate, so long as the insulating substrate includes a monocrystalline silicon portion at its surface from which the monocrystalline silicon regions 26 and 66 can be epitaxially grown.

What is claimed is:

1. An integrated device incorporating a plurality of interconnected vertical IGFETs on a substrate surface, comprising:
   a monocrystalline silicon region extending from an area of the substrate surface; and
   a plurality of insulated gate electrodes which are disposed in an overlying and substantially coincident relationship with respect to each other and which can be selectively biased, each of said insulated gate electrodes being contiguous with a segment of the monocrystalline silicon region such that a predetermined voltage applied to a particular electrode creates an inversion channel in the segment of the monocrystalline silicon region contiguous therewith each of said inversion channels having a length which is perpendicular to the substrate surface.

2. A device in accordance with claim 1 wherein each insulated gate electrode comprises an electrode having an aperture therein, said electrode being substantially surrounded by insulation.

3. A device in accordance with claim 2 wherein the apertures in the insulated gate electrodes are coincident and said monocrystalline silicon region extends through the coincident apertures.

4. A device in accordance with claim 1 wherein the monocrystalline silicon region comprises overlying source, body and drain regions of alternate conductivity type, the body region being contiguous with the electrode.

5. A device in accordance with claim 4 wherein the substrate is monocrystalline silicon of the same conductivity type as the source region.

6. A device in accordance with claim 1 wherein the substrate surface includes a monocrystalline contact portion, of relatively high conductivity, from which the monocrystalline silicon region extends.

7. A device in accordance with claim 6 wherein the monocrystalline silicon region is substantially entirely relatively low conductivity material of opposite conductivity type to said contact portion, and includes a drain region of relatively high conductivity which is of similar conductivity type as said contact region, said drain region comprising the uppermost portion of the monocrystalline silicon region.

8. A device in accordance with claim 1 wherein the uppermost portion of the monocrystalline silicon region is connected to a source of drain voltage.

9. A device in accordance with claim 1 wherein the area of the substrate surface from which the monocrystalline silicon region extends is connected to a source of source voltage.

* * * * *